United States Patent
Mikhail et al.

(10) Patent No.: US 11,336,226 B2
(45) Date of Patent: May 17, 2022

(54) COMPENSATING TEMPERATURE NULL CHARACTERISTICS OF SELF-COMPENSATED OSCILLATORS

(71) Applicants: David H. G. Mikhail, Cairo (EG); Ahmed Elkholy, Champaign, IL (US); Ahmed Helmy, Rehab City (EG); Mohamed A. S. Eldin, Cairo (EG); Omar Essam El-Aassar, Heliopolis (EG); Nabil Sinoussi, El-Shorook (EG); Ahmed ElSayed, Heliopolis (EG); Mohamed Abd ElMoneim Bahry, Cairo (EG)

(72) Inventors: David H. G. Mikhail, Cairo (EG); Ahmed Elkholy, Champaign, IL (US); Ahmed Helmy, Rehab City (EG); Mohamed A. S. Eldin, Cairo (EG); Omar Essam El-Aassar, Heliopolis (EG); Nabil Sinoussi, El-Shorook (EG); Ahmed ElSayed, Heliopolis (EG); Mohamed Abd ElMoneim Bahry, Cairo (EG)

(73) Assignee: Si-Ware Systems SAE, Caigo (EG)

( * ) Notice: Subject to any disclaimer, the term of this patent is extended or adjusted under 35 U.S.C. 154(b) by 0 days.

(21) Appl. No.: 16/735,395

(22) Filed: Jan. 6, 2020

(65) Prior Publication Data
US 2020/0144964 A1 May 7, 2020

Related U.S. Application Data

(63) Continuation of application No. 15/082,507, filed on Mar. 28, 2016, now abandoned, which is a continuation of application No. 14/885,244, filed on Oct. 16, 2015, now abandoned, which is a continuation of application No. 14/670,711, filed on Mar. 27, 2015, now abandoned.

(51) Int. Cl.
| | |
|---|---|
| *H03B 5/04* | (2006.01) |
| *H03L 1/02* | (2006.01) |
| *H03B 5/12* | (2006.01) |
| *H03B 27/00* | (2006.01) |
| *H03L 7/00* | (2006.01) |

(52) U.S. Cl.
CPC ............ *H03B 5/04* (2013.01); *H03B 5/1265* (2013.01); *H03B 27/00* (2013.01); *H03L 1/023* (2013.01); *H03L 1/025* (2013.01); *H03L 7/00* (2013.01); *H03B 2201/0208* (2013.01)

(58) Field of Classification Search
CPC ... H03L 1/02; H03L 7/00; H03L 1/023; H03L 1/025; H03B 5/04; H03B 5/1265; H03B 27/00; H03B 2201/0208
USPC .................................. 331/176, 167, 117 FE
See application file for complete search history.

(56) References Cited

U.S. PATENT DOCUMENTS

| | | | |
|---|---|---|---|
| 8,514,028 B2 * | 8/2013 | Ding | ................... H03B 5/1228 331/108 D |
| 2014/0232475 A1 * | 8/2014 | Elkholy | ................... H03L 1/04 331/44 |

* cited by examiner

Primary Examiner — Arnold M Kinkead
(74) Attorney, Agent, or Firm — Useful Arts IP

(57) ABSTRACT

Techniques are described that enables controlling the TNULL characteristic of a self-compensated oscillator by controlling the magnitude and direction of the frequency deviation versus temperature, and thus, compensating the frequency deviation.

22 Claims, 9 Drawing Sheets

1201I

COMPENSATING TEMPERATURE NULL CHARACTERISTICS OF SELF-COMPENSATED OSCILLATORS

BACKGROUND

In U.S. Pat. No. 8,072,281 ("Hanafi"), entitled "Method, system and apparatus for accurate and stable LC-based reference oscillators," issued Dec. 6, 2011 and incorporated herein by reference, the Temperature Null (TNULL) phenomenon has been analyzed and illustrated. On operating an LC tank at its TNULL phase, the oscillation frequency exhibits minimal frequency variation versus temperature. Related U.S. Pat. No. 8,884,718 entitled "Method and apparatus to control the LC tank temperature null characteristic in a highly stable LC oscillator," issued Nov. 11, 2014, is also incorporated hereby by reference.

The oscillator which can force the LC tank to oscillate at its TNULL phase utilizing the TNULL phenomenon is said to be a "TNULL oscillator". It is also called a "Self-Compensated Oscillator" in the sense that it exhibits minimal frequency variations across temperature without the need for external compensation circuitry. It is denoted as "SCO" for simplicity.

FIG. 1 presents the generic SCO. The oscillator consists of:
1. An LC tank circuit 101 to define the oscillating frequency.
2. A $g_m$-cell 103 to compensate the losses of the tank circuit to start and sustain oscillations.
3. A phase block ($\Phi$) 105 to adjust the phase of the tank impedance.

Herein, the phase $\Phi$ is programmed such that it is as close as possible to the inverted tank TNULL phase "$-\Phi_{GNULL}$"; thus the phase of the tank impedance becomes $\Phi_{GNULL}$. This is achieved by equating the frequency at the temperature range extremes $T_o-\Delta T$ and $T_o+\Delta T$. In this case, the frequency deviates within this temperature range by the oscillator inherent behavior and no mechanism is applied to control the oscillator behavior.

The profile of the frequency variation versus temperature at the TNULL phase is denoted by the "Temperature Null Characteristic" or the "TNULL Characteristic".

In Hanafi, a first order model for the tank variation versus temperature was analyzed and the theoretical expectation for the TNULL characteristic was introduced as shown in FIG. 2. The first order model of the tank versus temperature included the temperature variations of the inductor DC (direct current) losses only.

Practically, there are other factors that affect the TNULL characteristic, such as and not limited to:
1. The temperature varying harmonics induced by the active circuitry.
2. The temperature varying parasitic capacitances imposed by the routing interconnects and the active circuitry.
3. The temperature varying non-ideal effects in the inductor of the tank such as the skin depth effect and the proximity effect.
4. The temperature variation of the capacitance of the tank.

Due to such factors, the practical TNULL characteristic deviates from the theoretical expectations of the first order model. The shape of the practical TNULL characteristic varies according to the weight of each factor and the combination of the different factors. FIG. 3 compares three examples for possible practical TNULL characteristics to the theoretical TNULL characteristic as expected based on the first order model. The TNULL characteristic is the shape of the frequency deviation $\Delta f(T)$ versus temperature, where $\Delta f(T)$ is the frequency deviation referred to the oscillation frequency at the extremes of the temperature range $T_o-\Delta T$ and $T_o+\Delta T$ when operating at TNULL. Note that the frequency at the temperature range minimum $T_o-\Delta T$ is equal to the frequency at the temperature range maximum $T_o+\Delta T$ on operating at TNULL. This equality is an intrinsic feature of the TNULL characteristic since the TNULL phase is obtained by equating the phase-frequency plots at both $T_o+\Delta T$ and $T_o-\Delta T$. Hence, $\Delta f(T)$ is given as:

$$\Delta f(T) = \frac{f(T) - f(T_o - \Delta T)}{f(T_o - \Delta T)} = \frac{f(T) - f(T_o - \Delta T)}{f(T_o + \Delta T)}$$

The excursion in the TNULL characteristic from the nominal frequency in the temperature range of $T_o-\Delta T$ to $T_o+\Delta T$ has several disadvantages such as increasing the overall frequency deviation versus temperature, complicating the trimming and calibration process and violating the initial accuracy specification which is the value of the frequency deviation at $T_o$ that is usually the room temperature.

SUMMARY

Techniques are described that enable controlling the TNULL characteristic by controlling the magnitude and direction of the frequency deviation versus temperature, and thus, compensating the frequency deviation.

It is worth noting that compensating an SCO operating at TNULL is more convenient than compensating a conventional LC oscillator operating at a phase away from $\Phi_{GNULL}$, for example as in U.S. Pat. Nos. 7,332,975 and 8,134,414. This stems from the fact that the magnitude of the frequency deviation of the SCO is much smaller than that of the conventional LC oscillators. Thus, the SCO offers a better initial point to apply frequency compensation which yields the following advantages in the compensation system:
1. Operating at TNULL requires a smaller dynamic range for the compensation circuits because the frequency excursions that should be compensated in the case of the SCO are appreciably smaller than those in the case of the conventional LC oscillator.
2. Lower frequency deviation at TNULL implies that a lower temperature-to-frequency gain is required at the compensation loop, resulting into lower noise translation from the temperature sensor and the compensation circuitry to the oscillator output phase noise.
3. The oscillator may become less sensitive to process corners when trimmed to operate at TNULL.

BRIEF DESCRIPTION OF THE DRAWING FIGURES

The present invention may be further understood from the following detailed description in conjunction with the appended drawing figures. In the drawing.

DETAILED DESCRIPTION

Figure 1:
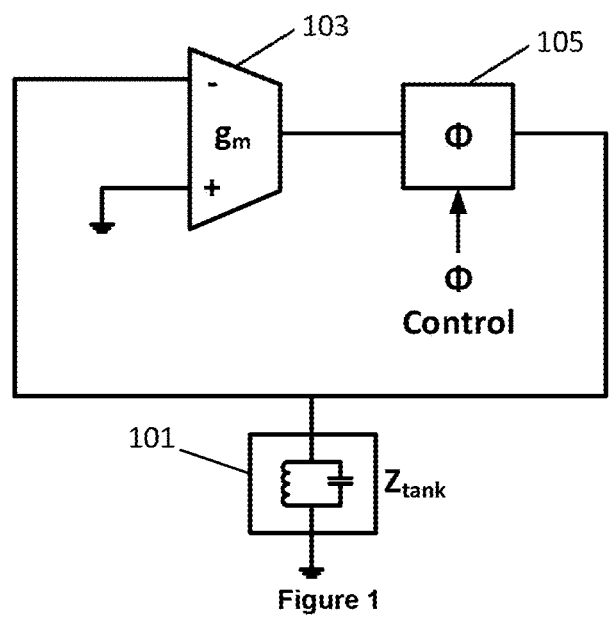
FIG. 1 is a block diagram of a self-Compensated Oscillator (SCO).
Figure 2:
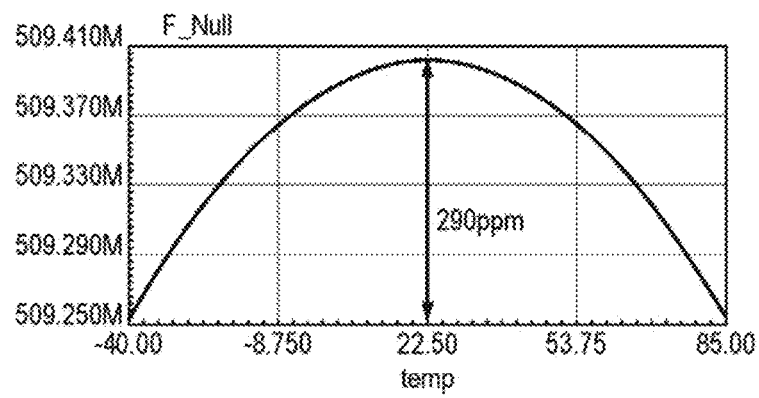
FIG. 2 is a graph illustrating a theoretical TNULL characteristic based on the first order temperature model.
Figure 3:
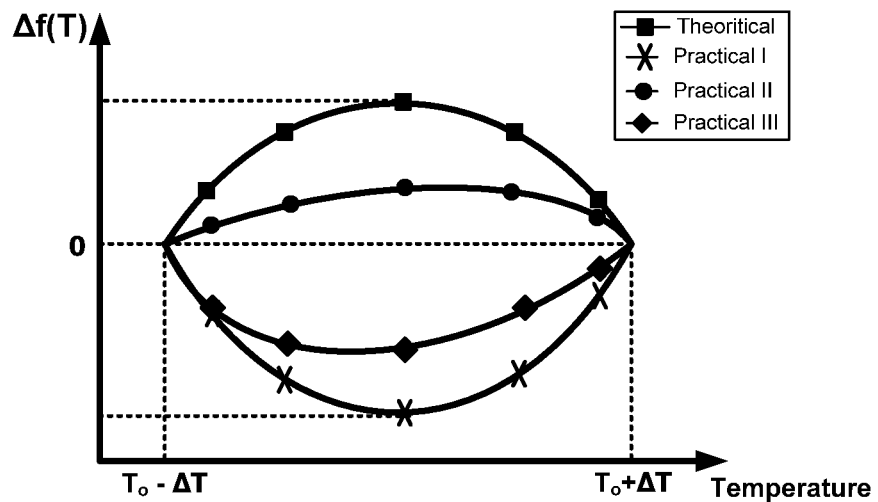
FIG. 3 is a graph illustrating three possible practical TNULL characteristics versus the theoretical TNULL characteristic derived from the first order model.
Figure 4:
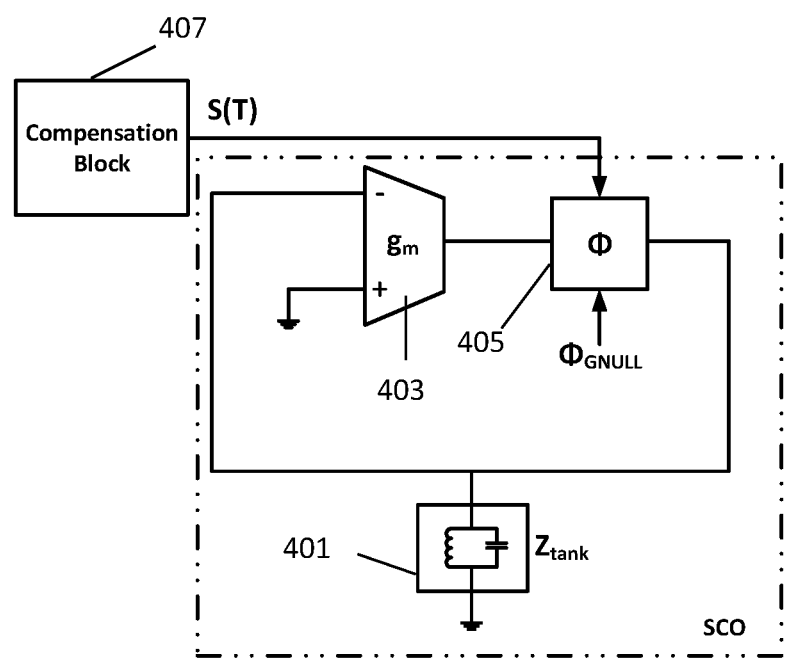
FIG. 4 is a block diagram of a SCO with the TNULL characteristic compensation applied through varying the LC tank phase versus temperature (Phase Compensation).
Figure 5:
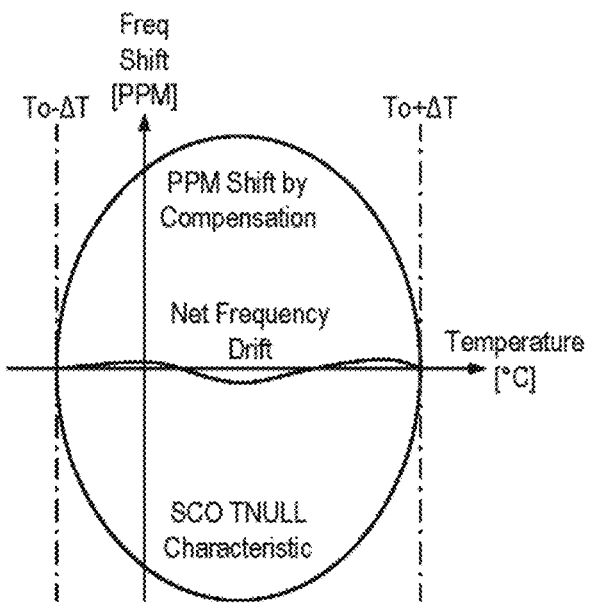
FIG. 5 is a graph illustrating SCO frequency deviation before and after applying the compensation of the TNULL characteristic.

Referring now to FIG. 4, there is shown the SCO with the proposed Phase Compensation applied. In FIG. 4, blocks 401, 403 and 405 correspond to blocks 101, 103 and 105 of FIG. 1. As explained in Hanafi, the ($\Phi$) control is adjusted such that the oscillator operates at $\Phi_{GNULL}$. Afterwards, the compensation block 407 generates a temperature-dependent control signal S(T). This control signal is then used to control the ($\Phi$) block in order to generate a phase ($\Phi$) between the voltage and current which follows a specific profile across temperature. The SCO output frequency depends on the value of $\Phi$ according to a specific sensitivity function; thus, the SCO exhibits a temperature-dependent frequency shift corresponding to the control signal S(T). The control signal profile across temperature is adjusted such that the generated frequency shift substantially cancels the TNULL characteristic (the inherent behavior of the oscillator deviation at TNULL) as shown in FIG. 5.

Figure 6:
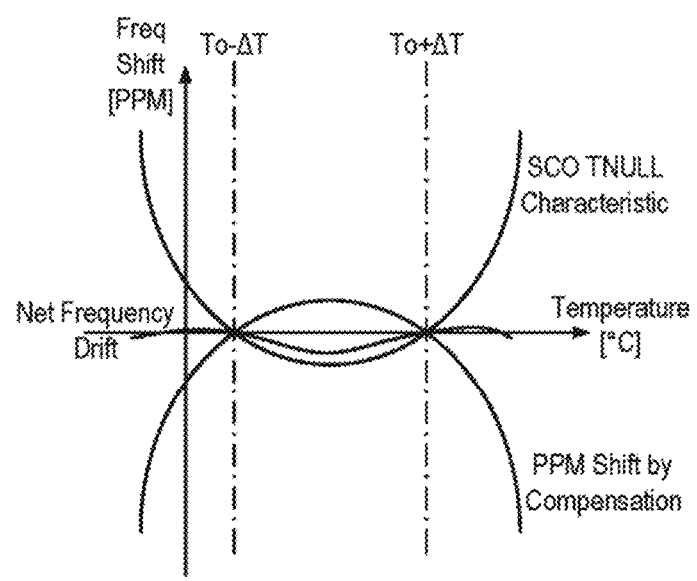
FIG. 6 is a graph illustrating compensating the frequency deviation of the SCO inside and outside the TNULL range.

The control signal profile can also be adjusted to compensate the oscillator inherent frequency deviation outside the TNULL operation range as well, as shown in FIG. 6. As illustrated in FIG. 6, the SCO is operating at the TNULL of the temperature range of $T_o-\Delta T$ to $T_o+\Delta T$ and the oscillator deviates significantly outside this range. The control signal in this case is used to compensate the frequency deviation outside the TNULL range as well.

Figure 7A:
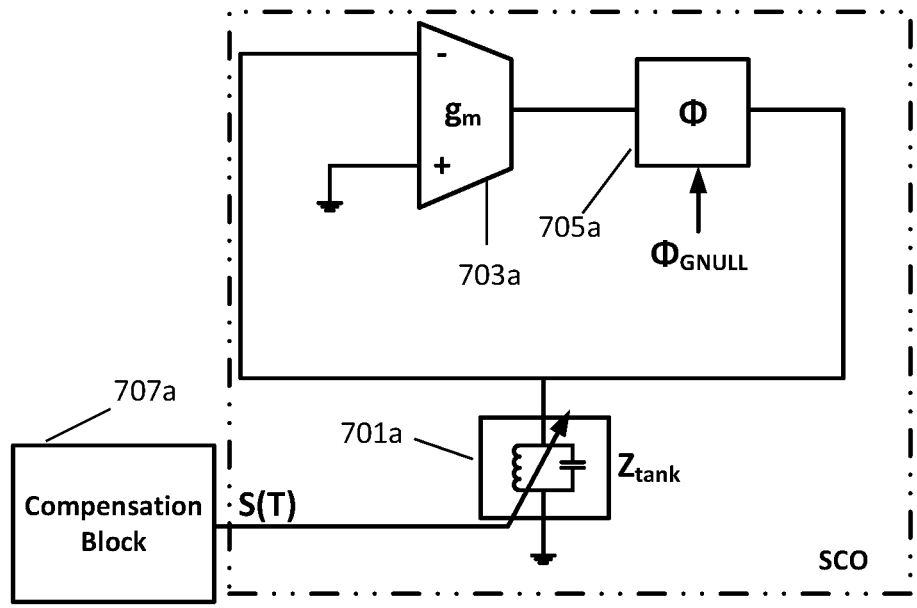
FIG. 7A is a block diagram of a SCO with TNULL characteristic compensation applied through varying the LC tank impedance ($Z_{tank}$) versus temperature (Impedance Compensation).

FIG. 7A presents a variation of the proposed compensation mechanism. In FIG. 7A, blocks 701a, 703a and 705a correspond to blocks 101, 103 and 105 of FIG. 1. In this case, a compensation block 707a is used to induce the compensating frequency shift by varying the value of $Z_{tank}$ i.e. S(T) controls the tank impedance of the SCO. As proposed earlier, the induced frequency shift can compensate the SCO inherent frequency deviation inside and outside the TNULL range.

Figure 7B:
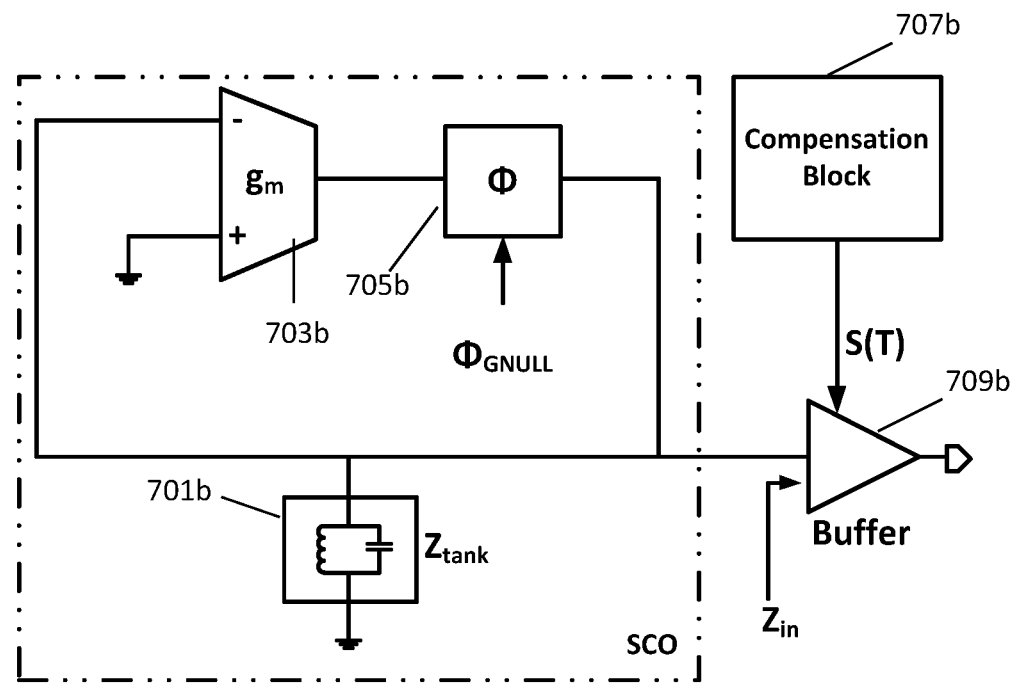
FIG. 7B is a block diagram of a SCO with TNULL characteristic compensation applied through varying the input impedance of the following buffer (Load Compensation).

Moreover, FIG. 7B shows a further compensation mechanism. In FIG. 7B, blocks 701b, 703b and 705b correspond to blocks 101, 103 and 105 of FIG. 1. This time a compensation block 707b provides a compensation signal S(T) that controls the input impedance of the active circuit which interfaces the SCO. Normally, an oscillator is followed by an active buffering circuit such as output buffer 709b which delivers the oscillator signal from the oscillator to the required recipients while protecting the oscillator from any possible undesired loading. The input impedance ($Z_{in}$) of such a buffer is considered as a part of the SCO tank impedance; thus, controlling the buffer input impedance ($Z_{in}$) across temperature induces a controllable frequency shift across temperature. This compensation mechanism is denoted as "Load Compensation". Load compensation can compensate the SCO inherent frequency deviation inside and outside the TNULL range.

Figure 8:
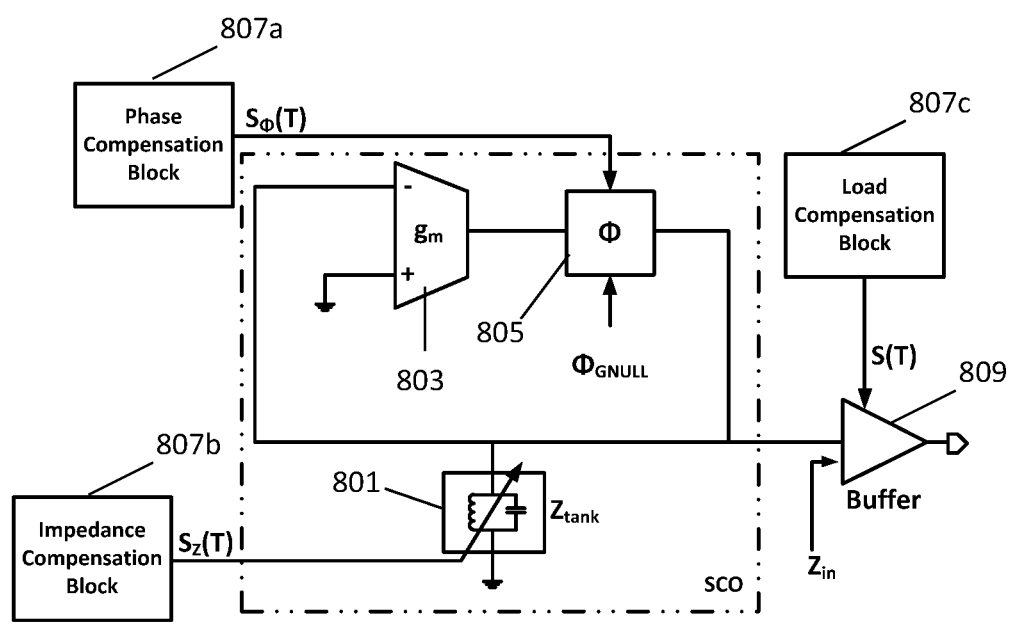
FIG. 8 is a block diagram of a SCO with TNULL characteristic compensation using phase compensation, impedance compensation and load compensation simultaneously.

Finally, the SCO can be compensated using a mix of all these techniques phase compensation, impedance compensation and load compensation as shown in FIG. 8. In FIG. 8, blocks 801, 803 and 805 correspond to blocks 101, 103 and 105 of FIG. 1. Compensations blocks 807a, 807b and 807c provide phase, impedance and load compensation, respectively.

Generally, the control signal (S(T)) generated by the compensation block can take several forms depending on the SCO architecture. For example and not for limitation, the control signal can be an analog signal, digital signal or a mix of both analog and digital signals. Furthermore, the control signal can be a voltage signal, a current signal or a mix of both current and voltage signals.

Figure 9A:
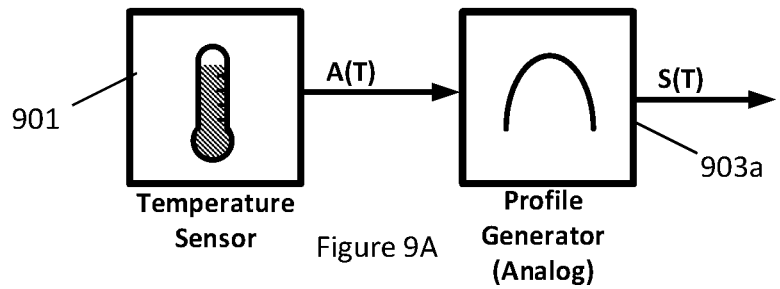
FIG. 9A is a block diagram of an example of a compensation block that can be utilized to compensate the SCO TNULL characteristic.

FIG. 9A to FIG. 9D shows different examples for generating the control signal (S(T)). In FIG. 9A, the temperature sensor 901 detects the die temperature and generates an analog signal (A(T)) that is substantially proportional to temperature. Afterwards, a control circuit, the profile generator block 903a, utilizes A(T) to generate S(T) with the specific temperature-dependent profile required to compensate the SCO TNULL characteristic. In FIG. 9A, the whole compensation process is done in the analog domain.

Figure 9B:
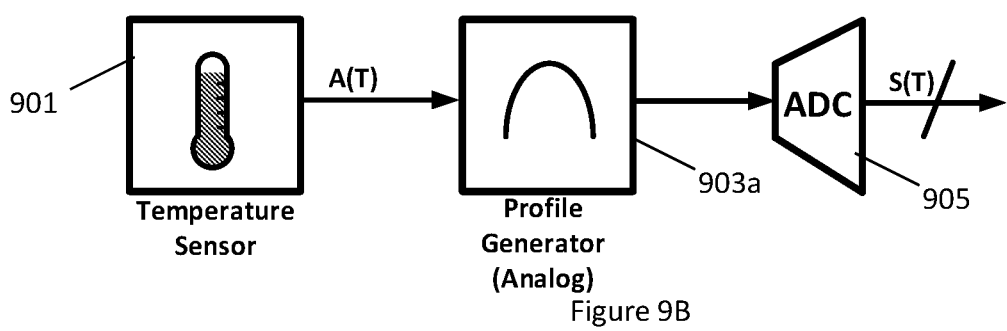
FIG. 9B is a block diagram of an example of a compensation block that can be utilized to compensate the SCO TNULL characteristic.

FIG. 9B illustrates a different concept. In FIG. 9B, blocks 901 and 903a correspond to blocks 901 and 903a of FIG. 9A. Herein, the SCO frequency is controlled using a digital signal; it is a Digitally-Controlled SCO (DCSCO). Thus, the control signal (S(T)) is transferred into the digital domain using an Analog-to-Digital Converter (ADC) 905 and then used to compensate the DCSCO.

Figure 9C:
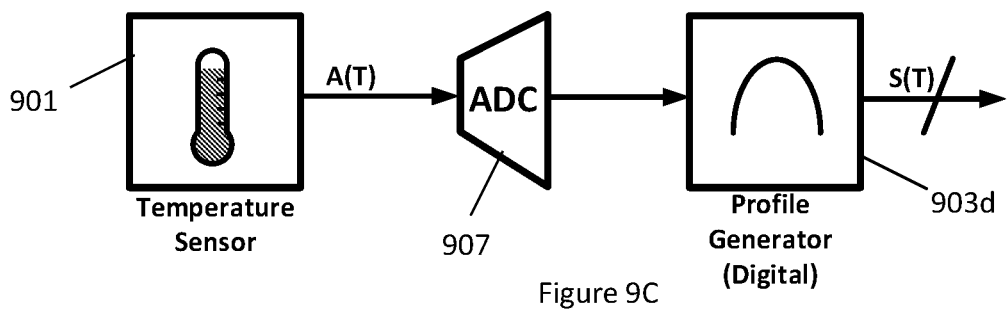
FIG. 9C is a block diagram of an example of a compensation block that can be utilized to compensate the SCO TNULL characteristic.
Figure 9D:
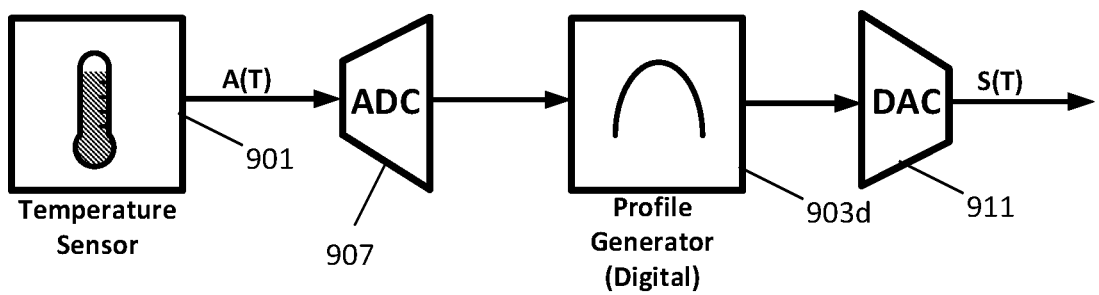
FIG. 9D is a block diagram of an example of a compensation block that can be utilized to compensate the SCO TNULL characteristic.

In FIG. 9C, the output of the temperature sensor 901 is transferred into the digital domain by an ADC 907 and then the compensation profile is generated digitally (block 903d). The digital control signal is then used to compensate the DCSCO. FIG. 9D illustrates a concept similar to FIG. 9C except that the output of the digital compensation block is transferred back to the analog domain using a Digital-to-Analog Converter (DAC) 911 and then used to compensate the SCO.

Furthermore, the topologies explained in FIG. 9A to FIG. 9D are for the sake of example and not for limitation. For instance, the SCO can be compensated using a combination of these topologies depending on the SCO architecture.

Compensation Examples

The following description presents some techniques for the proposed TNULL characteristic compensation. The presented techniques are demonstrated just for example and not for limitation.

Example I

Figure 10:
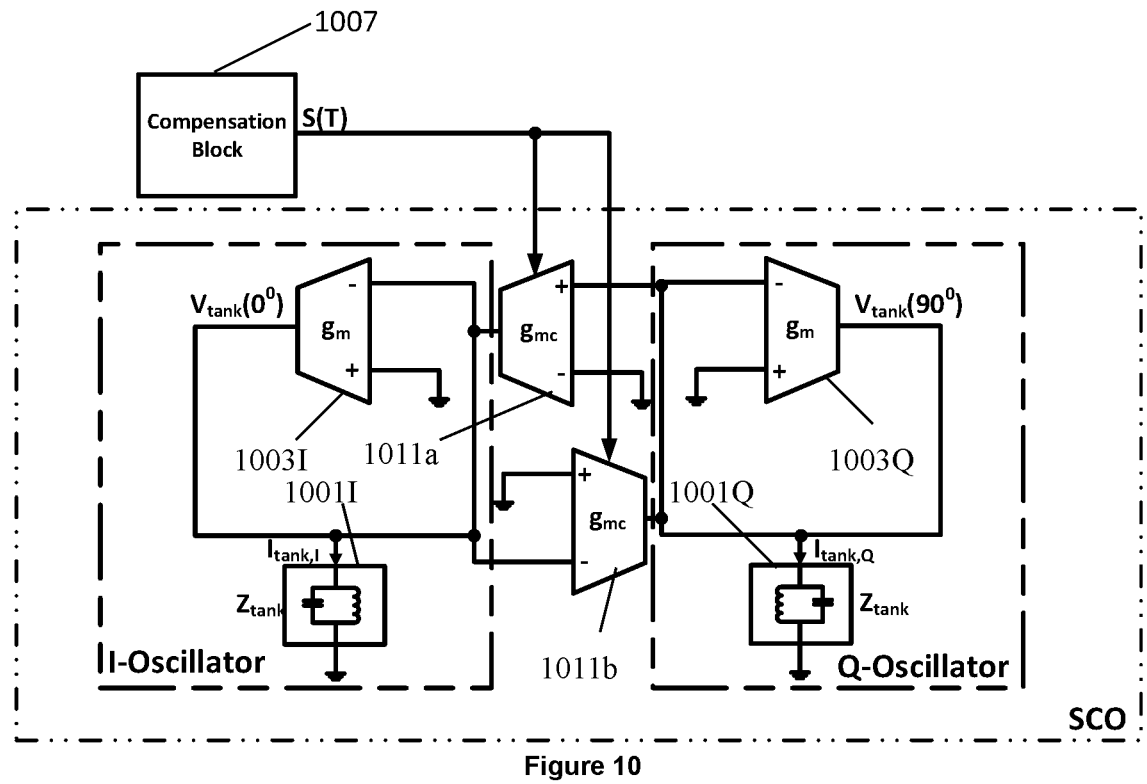
FIG. 10 is a block diagram of a an IQ SCO with phase compensation applied on the IQ SCO.

FIG. 10 shows the LC oscillator in a quadrature configuration. The quadrature configuration consists of two identical oscillator cores, the I-core and the Q-core, coupled together with the transconductance cells "$g_{mc}$" (1011a and 1011b). The I-core includes a tank 1001I and an amplifier 1003I. The Q-core includes a tank 1001Q and an amplifier 1003Q. As explained in Hanafi, the IQ oscillator can be configured to work as an SCO. The phase between the voltage and the current in the tank circuits is given by:

$$\Phi = \tan^{-1}\left(\frac{g_{mc}}{g_m}\right)$$

Where $g_{mc}$ is the coupling transconductance and $g_m$ is the oscillator core transconductance. The initial phase is adjusted to force the oscillator to operate at the TNULL Phase ($-\Phi_{GNULL}$). The compensation block 1007 then generates a temperature-dependent profile that modulates the $g_{mc}/g_m$ values and thus modulating the V-I phase. The control signal can modulate either $g_m$ or $g_{mc}$ and can be of analog nature, digital nature or a mix between analog and digital.

Figure 11:
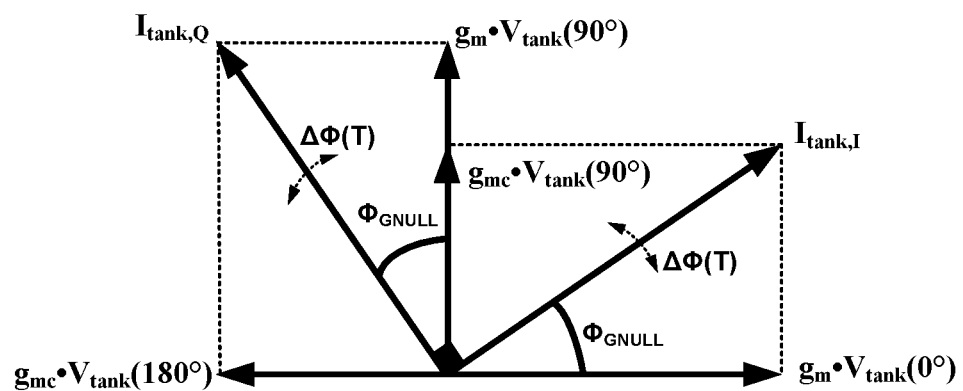
FIG. 11 is a phasor diagram of the IQ SCO of FIG. 10.

FIG. 11 shows the phasor diagram for the IQ oscillator. The oscillator is initially adjusted to operate as an SCO by adjusting V-I angle to $\Phi_{GNULL}$. Afterwards, the compensation block modulates the $\Phi_{GNULL}$ by $\Delta\Phi(T)$ using the control signal S(T). The modulated $\Delta\Phi(T)$ should induce a frequency shift that cancels the inherent frequency deviation of the SCO.

Example II

Figure 12:
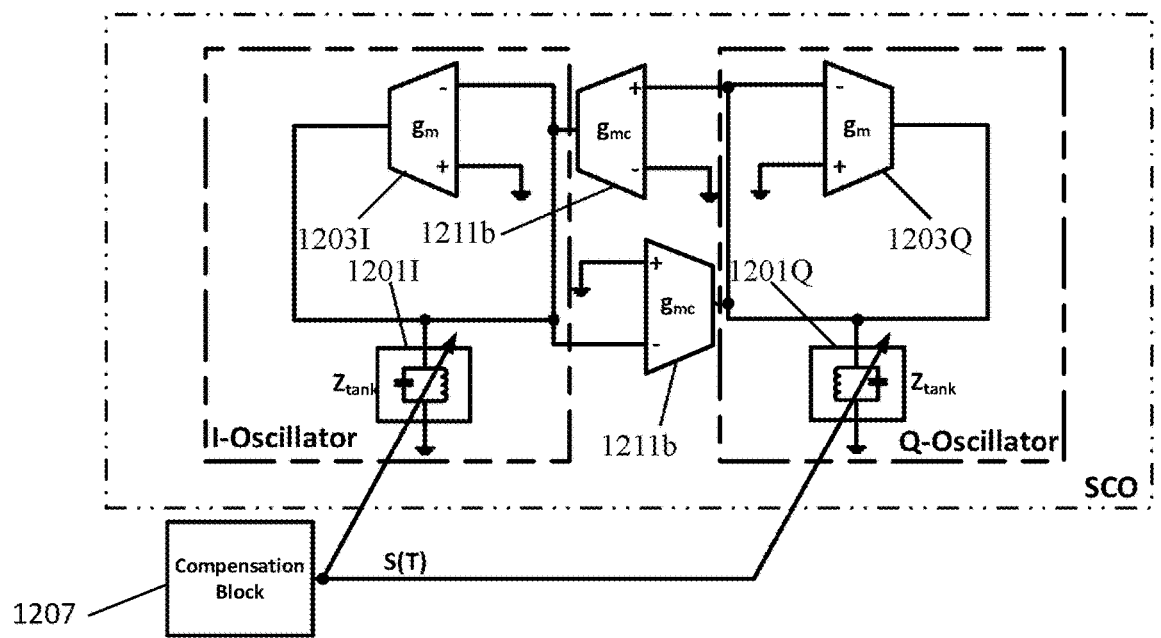
FIG. 12 is a block diagram of a an IQ SCO with impedance compensation applied on the IQ SCO.

FIG. 12 illustrates the proposed compensation for a quadrature oscillator core through the LC tank impedance. In FIG. 12, block 1201I, 1201Q, 1203I, 1203Q, 1211a and 1211b correspond to blocks 1001I, 1001Q, 1003I, 1003Q, 1011a and 1011b of FIG. 10. As explained in Example I, the $g_{mc}/g_m$ ratio is chosen to adjust the V-I phase to operate at the Null Phase TNULL. Afterwards, the compensation block modulates the tank impedance $Z_{tank}$ to compensate the oscillator inherent frequency deviation. The control signal can be in analog and/or digital form, and can modulate any part of the tank impedance as explained above.

Figure 13:
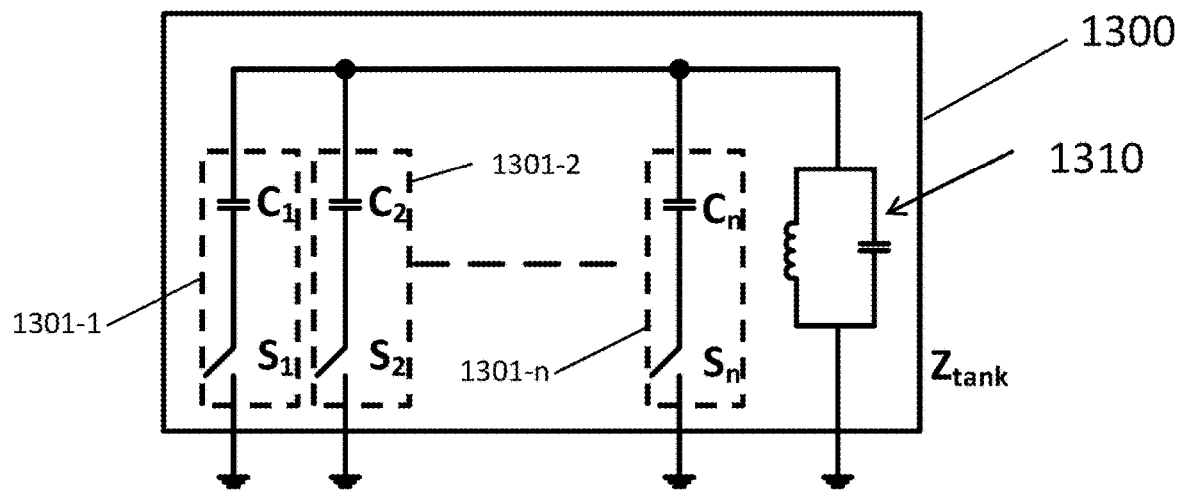
FIG. 13 is a diagram of digitally controlled capacitor units for compensating $Z_{tank}$.

FIG. 13 shows an example of compensating $Z_{tank}$ 1300, including a tank circuit 1310. In this example, the capacitive part of $Z_{tank}$ is modified using capacitor units 1301-1, 1301-2, . . . , 1301-n that are digitally switched on or off to compensate the frequency deviation of the SCO. Each capacitor unit includes a capacitor and a switch (e.g., $C_1$ and $S_1$ in the case of capacitor unit 1301-1).

Figure 14:
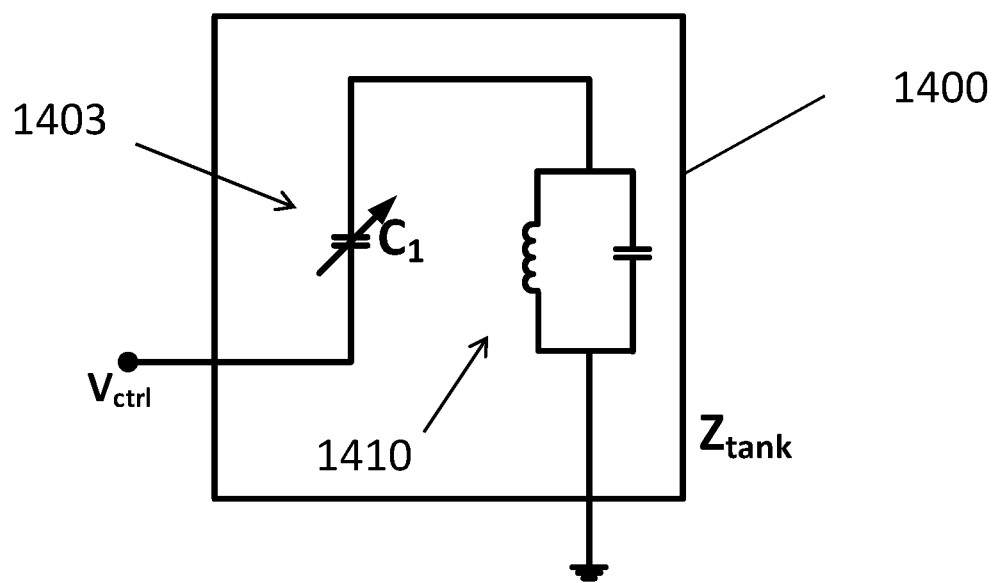
FIG. 14 is a diagram of an analog varactor for compensating $Z_{tank}$.

FIG. 14 shows another example for compensating the capacitive part of $Z_{tank}$. In FIG. 14, elements 1400 and 1410 correspond to elements 1300 and 1310 in FIG. 13. In this case, an analog varactor 1403 is connected in parallel to the tank circuit and its control voltage S(T) is supplied by the compensation block. A hybrid solution can utilize both the digitally-controlled capacitor units and the analog-controlled varactor as well.

It will be appreciated by those skilled in the art that the present invention may be embodied in other specific forms without departing from the spirit or essential character thereof. The foregoing description is therefore intended in all respects to be illustrative and not restricted. The scope of the invention is indicated by the appended claims, not the foregoing description, and all changes which come within the meaning and range of equivalents thereof are intended to be embraced therein.

What is claimed is:

1. An oscillator circuit comprising:
   an oscillator comprising:
   one or more frequency determining tank circuits; and
   one or more amplifiers coupled to the one or more tank circuits;
   circuitry for causing a phase shift between voltage and current of the one or more tank circuits, for causing the oscillator to operate at a temperature null operating point of reduced frequency variation over a temperature null temperature range, in accordance with a temperature null characteristic;
   one or more output buffers coupled to the oscillator; and
   a temperature compensation circuit comprising a temperature sensor and a control circuit coupled to the temperature sensor for generating one or more compensation signals, the one or more compensation signals being generated so as to counteract temperature-dependent frequency variations of the temperature null characteristic and being applied to the oscillator for reducing temperature variations over frequency at least within the temperature null temperature range;
   wherein the oscillator circuit is configured to generate the one or more compensation signals during normal operation, distinct from calibration, and to vary the one or more compensation signals in response to temperature sensed using the temperature sensor during normal operation; and
   wherein the oscillator circuit, in addition to operating as a self-compensated oscillator, operates also as a temperature-compensated oscillator.

2. The oscillator circuit of claim 1, wherein the one or more compensation signals are applied to the circuitry for causing a phase shift; thus controlling the phase shift of the one or more tank circuits to follow a desired function across temperature.

3. The oscillator circuit of claim 1, wherein the one or more compensation signals are applied to the one or more tank circuits; thus controlling the impedance of the one or more tank circuits to follow a desired function across temperature.

4. The oscillator circuit of claim 1, wherein the one or more compensation signals are applied to the one or more output buffers; thus controlling the input impedance of the one or more output buffers to follow a desired function across temperature.

5. The oscillator circuit of claim 1, wherein the one or more compensation signals are applied to the one or more tank circuits and the one or more output buffers.

6. The oscillator circuit of claim 1, wherein the control circuit comprises one or more profile generators for generating one or more temperature-dependent signals.

7. The oscillator circuit of claim 1, wherein the one or more compensation signals are analog.

8. The oscillator circuit of claim 1, wherein the one or more compensation signals are digital.

9. The oscillator circuit of claim 1, wherein the oscillator is an I/Q oscillator comprising an I oscillator core and a Q oscillator core, and two coupling transconductance cells coupling the I oscillator core and the Q oscillator core, transconductances of the coupling transconductance cells being chosen to cause the oscillator to operate at the temperature null operating point.

10. The oscillator circuit of claim 9, wherein the one or more compensation signals are used to vary the coupling transconductances as a function of temperature.

11. A method of producing a temperature-compensated oscillator signal, comprising:
    operating an oscillator at a temperature null operating point of reduced frequency variation over a temperature null temperature range, in accordance with a temperature null characteristic;
    sensing temperature using a temperature sensor;
    generating one or more temperature-dependent compensation signals so as to counteract temperature-dependent frequency variations of the temperature null characteristic; and
    applying the one or more compensation signals to the oscillator for reducing temperature variations over frequency at least within the temperature null temperature range;
    wherein the oscillator circuit is configured to generate the one or more compensation signals during normal operation, distinct from calibration, and to vary the one or more compensation signals in response to temperature sensed using the temperature sensor during normal operation; and
    wherein the oscillator, in addition to operating as a self-compensated oscillator, operates also as a temperature-compensated oscillator.

12. The method of claim 11, comprising:
    using one or more tank circuits to determine an oscillator frequency; and
    using the one or more compensation signals to influence a phase shift between voltage and current of the one or more tank circuits.

13. The method of claim 11, comprising applying the one or more compensation signals to the one or more tank circuits.

14. The method of claim 11, comprising using one or more output buffers to produce one or more output signals, and applying the one or more compensation signals to the one or more output buffers.

15. The method of claim 14, comprising applying the one or more compensation signals to the one or more tank circuits and the one or more output buffers.

16. The method of claim 11, comprising using one or more profile generators for generating one or more temperature-dependent compensation signals.

17. The method of claim 14, wherein the one or more compensation signals are analog.

18. The method of claim 14, wherein the one or more compensation signals are digital.

19. The method of claim 14, wherein the compensation signals are a mix of analog and digital signals.

20. The oscillator circuit of claim 1, wherein the compensation signals are a mix of analog and digital signals.

21. A method of controlling an oscillator comprising a phase shift network and a temperature compensation circuit comprising a temperature sensor, the method comprising:
    using the phase shift network to cause the oscillator to operate at a temperature null at which variations of frequency as a result of variations in temperature are reduced, the oscillator operating as a self-compensated oscillator; and
    at least within a region of operation about the temperature null, using the temperature compensation circuit to counteract expected frequency variations in accordance with temperature readings from the temperature sensor;
    wherein the oscillator generates one or more compensation signals during normal operation, distinct from calibration, and varies the one or more compensation signals in response to temperature sensed using the temperature sensor during normal operation;
    wherein the oscillator, in addition to operating as a self-compensated oscillator, operates also as a temperature-compensated oscillator.

22. An oscillator circuit comprising:
    a phase shift network; and
    a temperature compensation circuit comprising a temperature sensor;
    wherein the oscillator circuit is configured to:
    use the phase shift network to cause the oscillator circuit to operate at a temperature null at which variations of frequency as a result of variations in temperature are reduced, the oscillator circuit operating as a self-compensated oscillator; and
    at least within a region of operation about the temperature null, the temperature compensation circuit being configured to counteract expected frequency variations in accordance with temperature readings from the temperature sensor;
    wherein the oscillator circuit is configured to generate one or more compensation signals during normal operation, distinct from calibration, and to vary the one or more compensation signals in response to temperature sensed using the temperature sensor during normal operation; and
    wherein the oscillator circuit is configured to, in addition to operating as a self-compensated oscillator, operate also as a temperature-compensated oscillator.

* * * * *